United States Patent
Pochet et al.

(10) Patent No.: US 9,412,896 B2
(45) Date of Patent: Aug. 9, 2016

(54) METHOD FOR MANUFACTURING SOLAR CELLS, ATTENUATING LID PHENOMENA

(75) Inventors: Pascal Pochet, La Murette (FR); Sébastien Dubois, Scionzier (FR)

(73) Assignee: Commissariat A L'Energie Atomique et aux Alternatives, Paris (FR)

( * ) Notice: Subject to any disclaimer, the term of this patent is extended or adjusted under 35 U.S.C. 154(b) by 567 days.

(21) Appl. No.: 13/882,975

(22) PCT Filed: Oct. 28, 2011

(86) PCT No.: PCT/EP2011/068991
§ 371 (c)(1),
(2), (4) Date: Jun. 5, 2013

(87) PCT Pub. No.: WO2012/059426
PCT Pub. Date: May 10, 2012

(65) Prior Publication Data
US 2014/0147956 A1  May 29, 2014

(30) Foreign Application Priority Data
Nov. 2, 2010 (FR) .................... 10 58997

(51) Int. Cl.
*H01L 21/00* (2006.01)
*H01L 31/18* (2006.01)
*H01L 21/322* (2006.01)

(52) U.S. Cl.
CPC ........ *H01L 31/1864* (2013.01); *H01L 21/3221* (2013.01); *H01L 31/186* (2013.01); *H01L 31/1804* (2013.01); *Y02E 10/50* (2013.01); *Y02P 70/521* (2015.11)

(58) Field of Classification Search
USPC .................... 257/E21.318, E21.349; 427/551
See application file for complete search history.

(56) References Cited

U.S. PATENT DOCUMENTS

| 5,817,174 | A | * | 10/1998 | Tomita | ................... | C30B 29/06 117/106 |
| 6,010,797 | A | * | 1/2000 | Tomita | ................... | C30B 29/06 257/410 |

(Continued)

FOREIGN PATENT DOCUMENTS

FR  2906403 A1  3/2008
JP  11-74275 A1  3/1999

OTHER PUBLICATIONS

Liu et al., "Enhancement of He-Induced Cavities in silicon by Hydrogen Plasma Treatment", Journal of Vacuum Science and Technology: Part B, May 20, 2005, pp. 990-1023, vol. 23, No. 3, American Vacuum Society, Melville, New York, NY, USA, XP012080003.

(Continued)

*Primary Examiner* — Telly Green
(74) *Attorney, Agent, or Firm* — Baker & Hostetler LLP

(57) ABSTRACT

To reduce degradation, by the LID effect, of the conversion efficiency of photovoltaic cells made of crystalline silicon, one or more steps of controlled introduction of voids into the silicon are carried out by one or more steps chosen from among: siliciding, nitriding, ion implantation, laser irradiation, mechanical bending stress applied on one face of the silicon substrate, in combination with a temperature promoting the formation of voids in the substrate. These voids make it possible to reduce the level of interstitial oxygen by an effect of diffusion of VO complexes and precipitation of oxygen. The introduction of voids has the other effect of reducing the level of autointerstitials, and therefore of limiting the formation of interstitial boron. The phenomena of LID by activation of $B_iO_{i2}$ complexes are thus limited. This applies notably to photovoltaic cells based on monocrystalline or polycrystalline silicon having a high concentration of boron and oxygen.

11 Claims, 2 Drawing Sheets

(56) References Cited

U.S. PATENT DOCUMENTS

2003/0207044 A1    11/2003    Sopori
2008/0075840 A1    3/2008    Enjalbert et al.

OTHER PUBLICATIONS

S. Dubois, et al., "Is Impurity Gettering or Passivation by Hydrogen the Improvement Key of mc-Si Solar Cells During Processing Steps?", Materials Science and Engineering B, Mar. 15, 2009, pp. 239-241, vol. 159-160, Elsevier Sequoia, Lausanne, CH, XP026109128.

S. Dubois, et al., "Influence of Iron Contamination on the Performances of Single-Crystalline Silicon Solar Cells: Computed and Experimental Results", Journal of Applied Physics, Jul. 26, 2006, pp. 024510-1 thru 024510-7, vol. 100, No. 2, American Institute of Physics, New York, USA, XP012089526.

V.G. Zavodinsky, et al., Effects of Pressure and Hydrogen on the Formation of Vacancies and Divacancies in Crystalline Silicon, Semiconductors, Nov. 1, 2004, pp. 1241-1244, vol. 38, No. 11, XP055010393.

S. De Wolf, et al., "Solar Cells from Upgraded Metallurgical Grade (UMG) and Plasma-Purified UMG Muilti-Crystalline Silicon Substrates", Solar Energy Materials & Solar Cells, Apr. 1, 2002, pp. 49-58, vol. 72, No. 1-4, Elsevier Science Publishers, Amsterdam, NL, XP004339749.

Jan Schmidt, et al., "Structure and Transformation of the Metastable Boron- and Oxygen-Related Defect Center in Crystalline Silicon", Physical Review B, Jan. 22, 2004, pp. 24107-1 thru 24107-8, vol. 69, The American Physical Society.

Ji Youn Lee, et al., "Improvement of Charge Minority-Carrier Lifetime in p(Boron)-type Czochralski Silicon by Rapid Thermal Annealing", Progress in Photovoltaics: Research and Applications, 2001, pp. 417-424, vol. 9, John Wiley & Sons, Ltd.

V.V. Voronkov, et al., "Latent Complexes of Interstitial Boron and Oxygen Dimers as a Reason for Degradation of Silicon-Based Solar Cells", Journal of Applied Physics, 2010, pp. 53509-1 thru 53509-8, American Institute of Physics.

Donald A Clugston, et al., "PC1D Version 5: 32-Bit Solar Cell Modeling on Personal Computers", 26th IEEE Photovoltaic Specialists Conference, Oct. 1997, pp. 1-4, IEEE.

\* cited by examiner

METHOD FOR MANUFACTURING SOLAR CELLS, ATTENUATING LID PHENOMENA

CROSS-REFERENCE TO RELATED APPLICATIONS

This application is a National Stage of International patent application PCT/EP2011/068991, filed on Oct. 28, 2011, which claims priority to foreign French patent application No. FR 1058997, filed on Nov. 2, 2010, the disclosures of which are incorporated by reference in their entirety.

TECHNICAL FIELD

The invention relates to a method for manufacturing a photovoltaic cell, which is less sensitive to phenomena of LID ("Light Induced Degradation"), that is to say to the degradation of the photovoltaic conversion efficiency which occurs at the first times when the cell is exposed to light.

PRIOR ART

One aim in the development of photovoltaics is to reduce production costs in combination with improving the efficiency. Since the silicon substrate represents about 40% of the cost of the cells, research is addressing the development of a low-cost line of silicon of photovoltaic quality, that is to say a quality which lies between the very high quality of the silicon used in the electronics industry (highly pure silicon of electronics quality), and the less demanding quality of the silicon used in the metallurgical industry (silicon of metallurgical quality). Crystalline (monocrystalline or polycrystalline) silicon of photovoltaic quality is thus richer in metallic impurities (cobalt, copper, iron, etc.), in dopant impurities such as phosphorus, arsenic and boron, and in oxygen, than crystalline silicon of electronics quality.

One major object of this line is to be able to produce cells which are less expensive but have advantageous conversion efficiencies. This is one of the conditions for the development of a viable economic line. However, it is well known that the electronic properties (lifetime of the charge carriers, diffusion length) of a semiconductor are affected by the presence of point defects or extended defects in the atomic structure.

In particular, low-cost silicon substrates are very sensitive to LID phenomena, linked with the formation of boron and oxygen complexes which are activated under illumination. These phenomena lead to a degradation of the photovoltaic conversion efficiency (ratio of the electrical power provided at the output of the cell to the luminous power received) of the cells at the first times when they are used. This degradation is commensurately greater when the levels of oxygen and/or boron in the silicon substrate are high, even though other factors also participate in the degradation of the conversion efficiency, such as the quality of the cell at the end of manufacture (the worse the initial performance of the cell is, the greater is the degradation under illumination) and the presence of other impurities (notably phosphorus, carbon, aluminum).

The standard lines of manufacture use silicon doped with boron. Notably, in the low-cost silicon substrates used for photovoltaic cells, the levels of boron and oxygen generally exceed $3.10^{15}$ cm$^{-3}$ and $10^{17}$ cm$^{-3}$, respectively. The LID phenomena therein are particularly sensitive, with degradation of the conversion efficiency of the order of 8% relative to the conversion efficiency of the cell before exposure.

In the context of the low-cost silicon line, it thus appears imperative to find solutions for reducing the extent of this degradation.

Various techniques have already been proposed. Notably, anneals between 350 and 500° C. have been proposed in order to trap the oxygen in the form of thermal donors, as described for example in Part B "*Long term annealing at low temperature*" of an article by Jan Schmidt and Karsten Bothe, "*Structure and transformation of the metastable boron-and oxygen-related defect center in crystalline silicon*" (publication of 22 Jan. 2004—Physical Review, B69, 024107:1-8). However, the associated kinetics are very slow, which is not compatible with a low-cost line for mass production. Another solution applied to polycrystalline silicon uses rapid anneals, as described in the article "*Improvement of charge minority-carrier lifetime in p(boron)-type Czochralski silicon by rapid thermal annealing*" by Ji Youn Lee et al. (Progress in Photovoltaics: Research and Applications, 2001; 9:417-424). This solution can induce other defects affecting the electrical properties of the material, notably by causing initially precipitated impurities to enter solution. A technique of "regeneration" by illumination is also known, which consists in anneals between 80 and 200° C. carried out under illumination, the effect of which would be to "dissolve" the boron-oxygen defects. In practice, however, the regeneration effect obtained would prove temporary: after a certain time, the conversion efficiency is degraded again. Furthermore, this phenomenon is too slow to be industrializable.

SUMMARY OF THE INVENTION

There is therefore a genuine need to find a technical solution for limiting the LID phenomena, which produces a reliable and durable effect on the conversion efficiency, and which is perfectly integrated into a line of photovoltaic mass production. This is the object of the invention.

The invention is based on better knowledge of the activation mechanism of the boron-oxygen defects. A recent publication by V. V. Voronkov and R. Falster: "*Latent complexes of interstitial boron and oxygen dimers as a reason for degradation of silicon-based solar cells*"—Journal of Applied Physics 107, 053509 (2010), demonstrates a major mechanism of LID phenomena, which is a mechanism of activating complexes combining interstitial boron and oxygen under the effect of the illumination. More precisely, the illumination would cause electrical activation of the $B_iO_{i2}$ complexes (interstitial boron+interstitial oxygen dimer). These complexes would introduce a deep energy level into the forbidden band of the silicon, permitting recombination of the free charges with the result of reducing the lifetime of the carriers, and therefore the photovoltaic conversion efficiency of the cell. For further details about the activation mechanism of $B_iO_{i2}$ complexes under illumination, reference may usefully be made to the publication.

In the invention, an attempt has been made to exploit this demonstration of the major role of boron and interstitial oxygen in the LID phenomena.

In the invention, an attempt has been made to find an upstream technical solution which attacks the source of the degradation, that is to say which prevents or averts activation of the $B_iO_{i2}$ complexes responsible, in a way which is fully integrated into the process of making the silicide which does not affect the electrical properties of the crystalline silicon (monocrystalline or polycrystalline).

It will be recalled that, in a doped crystalline silicon substrate, the dopants, and notably boron which is of more particular interest here, are for the greatest part in a substituted position in the crystal lattice.

As explained in more detail in the aforementioned publication, the presence of boron in an interstitial position in the atomic structure of the silicon would be linked with the precipitation of oxygen. The mechanism would be as follows: during crystallization of the silicon (cooling step), the oxygen precipitates. As they are formed, the oxygen precipitates eject autointerstitials (interstitial silicon). These autointerstitials then interact with the boron atoms in a substituted position $B_s$ by a so-called kick-out mechanism: boron atoms are obtained in an interstitial position $B_i$. It is these interstitial borons which, by recombining with oxygen dimers (the concentration of which depends on the level of interstitial oxygen), form the recombinant $B_iO_{i2}$ complexes which cause the degradation of the conversion efficiency.

It is an object of the invention to provide a method making it possible to reduce the concentration of interstitial boron and/or interstitial oxygen, so as to reduce the possibility of formation of the $B_iO_{i2}$ complexes responsible, and therefore to reduce the extent of the LID phenomena in cells having low-cost crystalline silicon.

In order to achieve this, the invention proposes a method of controlled injection of voids into the atomic structure of the silicon substrate of the photovoltaic cell. It will be recalled that a void is a vacant site in the atomic structure of the silicon (where there ought to be a silicon atom there is nothing: the site is vacant). The injection of voids has the technical effect of promoting the formation of void-oxygen complexes, denoted VO. These VO complexes are traps for the $O_i$ atoms. The method thus makes it possible to reduce the level of interstitial oxygen $O_i$.

The injection of voids has the further technical effect of reducing the number of autointerstitials in the atomic structure of the silicon, and consequently makes it possible to limit the process of interstitial boron formation by kick-out.

The invention also relates to a method for manufacturing a photovoltaic cell from a silicon substrate, characterized in that it comprises at least one step of controlled introduction of voids into the silicon substrate.

A step of introducing voids into the crystalline silicon comprises one or more steps among the following steps: siliciding, nitriding, ion implantation, laser irradiation, mechanical bending stress applied on one face of the silicon substrate, in combination with a temperature promoting the void formation.

BRIEF DESCRIPTION OF THE DRAWINGS

Other characteristics and advantages of the invention will become apparent on reading the following detailed description, which is made with reference to the appended drawings in which.

DETAILED DESCRIPTION

Figure 1:
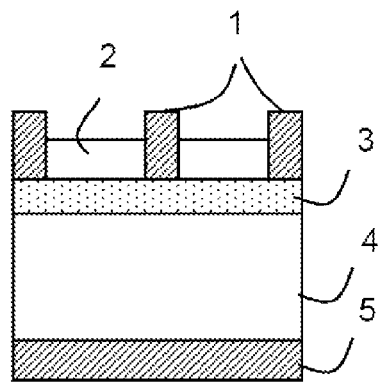
FIG. 1 schematically represents the structure of a standard photovoltaic cell.

A method for manufacturing a photovoltaic cell according to the invention comprises a step of controlled introduction of voids into the crystalline silicon, with a view to limiting the LID phenomena.

The injection of voids in excess into the substrate makes it possible to reduce the level of interstitial oxygen, by an effect of diffusion of VO complexes and precipitation of oxygen. The introduction of the voids has the further effect of reducing the level of autointerstitials, and therefore of limiting the formation of interstitial boron. The phenomena of LID by activation of $B_iO_{i2}$ complexes, of interstitial boron and of oxygen dimers, are thus limited.

In more detail, the first effect is the increase in the diffusion coefficient of the oxygen monomers. In a silicon which is "rich" in voids, the formation of void-oxygen complexes takes place. These complexes are denoted V—O: V for void and O denoting an oxygen monomer. These V—O complexes have a diffusion coefficient greater than that of the oxygen monomers on their own. Typically, the activation energy of the diffusion of interstitial oxygen is ~2.5 eV while that of the VO complexes is of the order of ~1.7 eV). The fact of accelerating the diffusion of oxygen makes it possible to accelerate the oxygen precipitation effects (or simple agglomeration effects). This precipitation effect is particularly pronounced in polycrystalline silicon, where it takes place along the extended crystallographic defects (dislocations, macles, grain boundaries), but also in monocrystalline silicon by agglomeration (intrinsic or in the vicinity of an impurity) of oxygen atoms. This contributes to reducing the level of interstitial oxygen and consequently the level of oxygen dimers.

The second effect is the decrease in the level of silicon autointerstitials. It has been seen that autointerstitials promote the passage of boron from a substitutional position in the crystal lattice to an interstitial position. The injection of voids thus makes it possible to reduce the level of interstitial boron.

These two effects, which combine, make it possible to limit the possibility of formation of $B_iO_{i2}$ complexes, and therefore to reduce the concentration thereof in silicon exposed to illumination.

For example, for a photovoltaic cell produced according to a standard industrial process from a Cz monocrystalline substrate with a boron content of $4.10^{16}$ cm$^{-3}$ and an initial interstitial oxygen content of $7.10^{17}$ cm$^{-3}$, the following efficiency values can be expected when using behavioral modeling software available to the person skilled in the art, such as the PC1D software ("*PC1D version* 5: 32 *bit solar cell modeling on personal computers*", of Donald A. Clugston and Paul A. Basore, Photovoltaic specialists Conference, October 1997): 17.3% before any exposure to light; 16.1%, after the first exposure to light, i.e. an efficiency loss due to LID phenomena of 1.2% in absolute terms (close to 7% in relative terms).

With a photovoltaic cell produced from the same Cz silicon substrate, with the same initial levels of boron and interstitial oxygen, but produced by a process including a void introduction step according to the invention, the conversion efficiency after any first exposure to illumination is evaluated at 17.2% by simulation, i.e. an efficiency loss due to LID phenomena of only 0.1% in absolute terms (close to 0.6% in relative terms): the extent of the LID effects is reduced by a factor of 10.

The gain obtained depends in practice on the control parameters of the step of introducing voids, notably the temperature, but also other degradation factors such as those induced by the metallic impurities contained in the substrate, the crystallographic growth mode of the silicon, etc.

Before describing the void introduction step according to the invention in detail, the main steps of a method for manufacturing a photovoltaic cell will be recalled, assuming the most common case of a p-type crystalline silicon containing boron, which also corresponds to the case in which the LID phenomena induced are the greatest, owing to the high boron concentration.

A standard process for manufacturing a photovoltaic solar cell comprises the following main steps:

preparation of p-type crystalline silicon containing boron.

formation of the emitter by diffusion of an n-type dopant, typically phosphorus, over a depth of the order of one micrometer (formation of a semiconductor junction). Typically, the emitter is formed by the n-diffused region while the base is formed by the p-doped substrate.

formation of the metal contacts of the base and the emitter, comprising screen printing deposition of a layer of aluminum on the rear face and a layer of silver on the front face (emitter side), and a rapid anneal at high temperature, for example toward 800° C., typically in a continuous infrared furnace, in order to produce the silicon-metal contact on each face. The annealing conditions, more particularly the temperature and the duration, are dictated by the wide-spread properties of silver. Notably, the temperature of the anneal should not exceed 900° C. and the duration of the anneal is of the order of 10 seconds.

The standard method may comprise other steps, which make it possible to improve the performance of the cell. Notably, mention may be made of texturing of the surfaces of the silicon substrate, making it possible to increase the amount of light absorbed by the material through the creation of surface roughness, as well as the deposition of at least one antireflection layer on the front face (layer of silicon silicon nitride SiN), before the front face metallization layer, in order to limit the losses by reflection.

A corresponding photovoltaic cell structure is illustrated very schematically in FIG. 1, with, starting from the front face, the front-face metal contacts 1, an antireflection layer 2, the emitter 3, the base 4 and the rear-face metal contact 5.

Other photovoltaic cell structures exist. Notably, mention may be made of rear-contact cells, in which the base and emitter contacts are produced on the rear face, generally in the form of interdigitated combs, or multi-emitter cells, etc. The invention applies in general to all these crystalline silicon cells, and more especially to cells with boron-doped crystalline silicon also containing oxygen, in order to reduce the extent of the LID phenomena in these cells.

A manufacturing step according to the invention comprises a step of controlled injection of voids into the silicon.

This step of controlled injection of voids can be carried out in various ways, which may be combined with one another in order to obtain the desired effect.

In a first embodiment, controlled introduction of voids into the crystalline silicon substrate uses a step using a material which reacts with silicon on one face of the substrate, at a temperature promoting formation of voids in the substrate. This step may be a step of forming a silicide, or a nitriding step.

A step of forming a silicide typically comprises:

a step of depositing a metal layer on one face of the substrate, by any technique available to the person skilled in the art (for example, and not limitingly, by screen printing, vacuum evaporation, cathode sputtering, ink-jet, immersion or electrodeposition).

a step of annealing in order to form the silicide, which may be carried out either in air or in a controlled atmosphere.

The associated void formation mechanism can be explained by a phenomenon of compressive mechanical stress applied by the layer of silicide, combined with diffusion of voids which is promoted by the annealing temperature.

More precisely, the void formation by siliciding may follow two mechanisms, depending on the properties of the metal used.

A first mechanism of formation of voids, which applies to metals such as silver, gold or aluminum, with formation of the alloy which takes place in the liquid phase, explained by a negative volume variation during the formation of the silicide, that is to say a contraction.

A second mechanism of formation of voids, which applies to metals such as titanium, palladium, cobalt, iron, nickel or platinum, with formation of the alloy in the solid phase, is explained by diffusion of silicon atoms in order to form the silicide at the interface between the silicon and the metal. This flow of silicon into the silicide creates a reverse flow of voids into the silicon. This is the Kirkendall effect.

In all cases, the parameters of the anneal, and principally the temperature, should permit both the siliciding and the void formation. This temperature varies according to the metal selected, but it is higher than the temperatures which silver can withstand, which in practice makes it necessary to carry out any step of void formation by siliciding before the formation of the silver metallizations. The duration of the anneal makes it possible to control the amount of voids injected, as a function of the flow induced at the selected temperature.

Various exemplary embodiments of this siliciding step, taking these various constraints into account, are described below.

First Example

Figure 3:
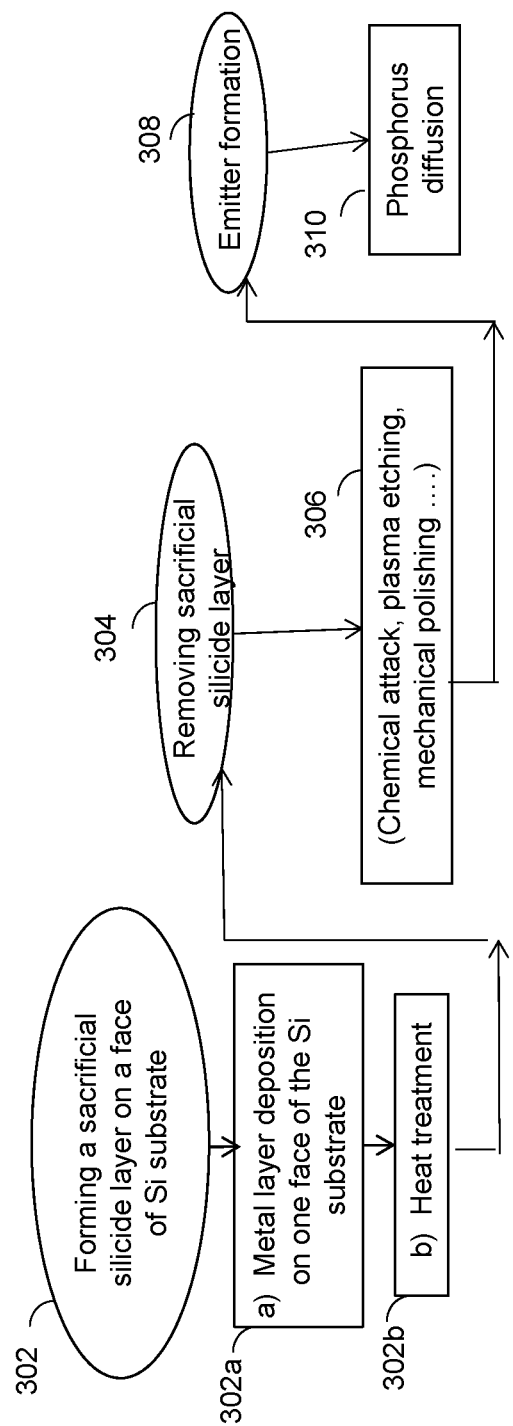
FIG. 3 illustrates an example method for manufacturing a photovoltaic cell from a crystalline silicon substrate.

For example, as illustrated in FIG. 3, the step 300 of introducing voids by siliciding comprises a step of producing (step 302) at least one sacrificial silicide layer, that is to say to a layer which is produced only for the purpose of forming the voids in the silicon substrate, and which is subsequently removed in step 304.

The steps of forming (step 302) and removing (step 304) the sacrificial silicide layer are carried out before forming the metal contacts. The silicide layer is removed by any suitable technique, for example by chemical attack, by plasma, or by mechanical polishing (step 306), before resuming the standard manufacturing process.

The sacrificial silicide layer may be formed with one of the aforementioned metals, or a composition of a plurality of metals (step 302a).

In a first refinement, the step of introducing voids comprises the consecutive formation of two sacrificial silicide layers, each in the conditions promoting one and/or other of the void formation mechanisms (liquid phase, solid phase). The range of control over the flow of voids injected is thus widened (different metals, different temperatures and/or durations for each metal).

Typically, the step of introducing voids comprises the formation (step 302) of a first sacrificial silicide layer on one face of the substrate (step 302a), removal (step 304) of this layer before producing the second sacrificial silicide layer, which is then also removed, before resuming the course of the standard manufacturing process.

This step of void formation by siliciding may advantageously be carried out before the texturing of the faces of the substrate, thus making it easier to remove the sacrificial silicide layer.

Preferably, the sacrificial layer is produced on the rear face of the substrate, in order to avoid any superfluous contamination of the front face of the cell (step 302a).

Advantageously, this step of forming the sacrificial silicide layer is carried out before the step 310 of diffusion of phosphorus into the silicon. This is because the high-temperature heat treatment in step 302b, generally between 800 and 900° C., which makes it possible for the phosphorus to diffuse into the silicon (formation of the emitter in step 308) has an additional known effect as an external getter by segregation of the metallic impurities contained in the silicon. This getter effect then makes it possible to extract the metal of the sacrificial layer which might be introduced into the bulk of the silicon in the siliciding annealing step.

An additional effect is obtained by selecting a metal such as nickel, making it possible to form a silicon-rich silicide layer. The metal and the annealing temperature are then selected in order to promote the formation of metal grains which are small compared with the silicon. The size of the metal grains also depends on the conditions of duration and temperature increase and decrease. The nickel will then be deposited in a thickness which is a compromise between the duration of the deposition and the availability of metallic species (for example of the order of 1 micron), and the anneal will be carried out at a temperature of the order of 900° C., making it possible to form a nickel-silicon silicide promoting $NiSi_2$ coupling rather than $NiS_i$ coupling, taking into account the small size of the nickel grains obtained at this temperature.

Second Example

In this example, the step of formation of the aluminum metal contacts is advantageously used as the step of siliciding for the introduction of voids, by applying thereto the anneal control parameters which permit void formation, that is to say a temperature higher than the temperature conventionally used in the annealing step common to the silver and aluminum metal contacts and/or a longer annealing duration (for example 1 hour instead of 10 seconds).

This step of introducing voids by siliciding is then integrated into the manufacturing process in the following way:
 depositing the layer of aluminum, and annealing at a temperature of more than 577° C., making it possible to form the aluminum silicide and the voids in the silicon. The duration of the anneal is selected as a function of the injection flow of voids, which depends on the properties of aluminum, the annealing temperature applied, and the oxygen precipitation or agglomeration time. It is more than 1 minute.
 depositing the layer of silver, and rapid annealing at high temperature, typically between 800 and 850° C., for a few seconds, in order to form the silver metallizations.

The use of the step of forming aluminum metallizations in order to introduce voids provides additional advantages. Specifically, under the aluminum silicide annealing conditions applied in the invention, and in particular at the annealing temperature of at least 577° C., the aluminum will locally dope the silicon on the rear face, the effect of which is to form a repulsive field on the rear face for the photogenerated carriers.

Furthermore, it has been seen that the formation of the aluminum-silicon alloy takes place in the liquid phase. This liquid phase makes it possible to trap metallic impurities contained in the silicon by segregation via an external getter effect. The segregation of the metallic impurities contributes to improving the conversion efficiency of the cell.

These bonus effects of formation of a resistive field and of a getter effect contribute to obtaining a better-performing photovoltaic cell.

It is possible to provide a plurality of steps of controlled injection of voids by siliciding, with one metal or different metals, combining the various exemplary embodiments indicated. This widens the range of the control parameters (metals, temperature, duration) making it possible to control precisely the flow and amount of voids which are intended to be injected.

For controlled introduction of voids into silicon, using the reaction of a material with silicon, it is also possible to use nitriding of the silicon. A silicon nitriding step is, for example, carried out at a temperature of 1100° C. in nitrogen. This embodiment is particularly well suited to Cz silicon.

According to a second embodiment of the invention, the controlled introduction of voids into the substrate is carried out by applying a macroscopic mechanical stress, typically a bending stress, on the silicon substrate during an anneal at a temperature promoting the formation of voids in the silicon, for example an anneal under a flash lamp, for example from 900° C. to 1000° C. for 10 to 30 seconds.

According to a third embodiment of the invention, the controlled introduction of voids into the substrate is carried out by ion implantation of helium or hydrogen, followed by an anneal. This ion implantation step is preferably plasma ion implantation, which is less expensive to carry out.

The step of ion implantation of hydrogen or helium promotes the creation of nanocavities at the surface of the silicon.

The effect of the subsequent anneal is to allow the voids of these nanocavities to diffuse into the bulk of the material.

The control parameters of this step of introducing voids by ion implantation are then the ionic species (helium or hydrogen), its flow, the temperature, and the duration of the anneal. In the case of plasma implantation, these control parameters are the ionic species (helium or hydrogen), its concentration, the temperature and the duration of the anneal. For example, the following control parameters may be used: concentration (of hydrogen or helium): $3.10^{15}$ atoms/cm$^3$ at 250 keV, followed by an anneal at 750° C. for one hour in an argon flow.

As the ion implantation creates surface defects, this ion implantation will preferably be carried out on the rear face of the silicon, so as not to degrade the performance of the cell.

This step of introducing voids by ion implantation and annealing may be carried out at any time during the standard manufacture of the cells, but at least before the step of annealing the silver metal contacts, because of temperature conditions of the anneal after implantation not compatible with the low-temperature annealing constraints of silver.

In one exemplary embodiment, the step of ion implantation on the rear face of the substrate is carried out after the phosphorous diffusion step, and is followed by the deposition of a layer of aluminum on the rear face, then an anneal for a duration of more than 1 minute, which then simultaneously makes it possible to re-establish aluminum contact on the silicon and to inject the voids. The standard process then resumes with the deposition of the layer of silver and the associated low-temperature anneal.

Preferably, however, it will be carried out before the phosphorous diffusion, which allows greater flexibility in the choice of the pair of control parameters of the anneal (temperature, time).

An additional advantage is obtained by preferring ion implantation of hydrogen rather than helium, because the hydrogen atoms injected have the effect of electrically passivating defects (extended and point) present in the silicon substrate. Plasma-assisted ion implantation of hydrogen advantageously makes it possible to reduce the working costs.

According to a fourth embodiment of the invention, the controlled introduction of voids into the substrate is carried out by laser irradiation, followed by a subsequent anneal.

The effect of the laser irradiation is to generate extended crystallographic defects at the surface of the silicon. During the subsequent anneal, voids diffuse from these defects into the bulk of the silicon. As above for the ion implantation, because the irradiation creates surface defects it is preferred to irradiate only the rear face of the cell.

This step of introducing voids by laser irradiation and annealing may be carried out at any time during the standard manufacture of the cells, but before the step of forming the front and rear metal contacts of the cell, because of temperature conditions of the anneal after implantation, not compatible with the annealing constraints of silver.

It will preferably be carried out before the phosphorus diffusion step, which allows greater flexibility in the choice of the pair of control parameters of the anneal (temperature, time).

It may also be conceivable to carry out the laser radiation of the rear face of a phosphorus-diffused wafer, to deposit the layer of aluminum, and then to carry out the anneal simultaneously making it possible to form the rear-face contact and to inject the voids. The standard process then resumes with the deposition of the layer of silver on the front face and the associated anneal for forming the front-face metal contact.

The various exemplary embodiments of steps of introducing voids and their alternative embodiments may be used in combination in successive steps.

In a refinement which is applicable to each of the variants, the annealing steps making it possible to inject the voids may be carried out under illumination, the effect of which is to promote the diffusion of the point defects: the two effects combine favorably in order to trap the interstitial oxygen and limit the formation of interstitial boron.

Furthermore, the presence of hydrogen is known to accelerate the diffusion of the VO complexes. The preceding steps are preferably carried out after a treatment making it possible to hydrogenate the bulk of the cell. This may be a hydrogenation step provided as standard in the method, for example the step of forming an antireflection layer of hydrogen-rich silicon nitride (SiN—H) as standard.

The invention which has just been described consequently makes it possible to limit the amplitude of the degradation by LID effect. In practice, it is not possible to give a precise value for this limitation, because this amplitude of the degradation also depends on other factors: as seen above, other impurities contained in the silicon are involved. The quality of the cell, that is to say its post-manufacture performance, also has an influence. The amplitude of the LID effects is also variable from one crystallization method to another, from one type of silicon batch to another and from one cell architecture to another. An order of magnitude may, however, be given for a void introduction step according to the invention at a given temperature.

Taking, for example, a cell formed from a Cz monocrystalline silicon substrate heavily doped with boron ($[B]=4\times 10^{16}$ cm$^{-3}$), the interstitial oxygen concentration of which is $7\times 10^{17}$ cm$^{-3}$, according to a standard method not implementing the invention. This boron concentration is typically measured by Hall effect at temperature, or by mass spectrometry techniques (GDMS, ICP-MS). The interstitial oxygen concentration is typically measured by Fourier transform infrared (FTIR) spectroscopy.

For these concentrations, according to known modelings for Cz silicon, the lifetime of the minority charge carriers before degradation by the LID effect is 80 μs. The corresponding efficiency of the cell before degradation is then 17.3%.

After degradation, still according to the prior art, and by a simulation, it is 16.1%. There is thus an efficiency loss of close to 7% in relative terms.

Figure 2:
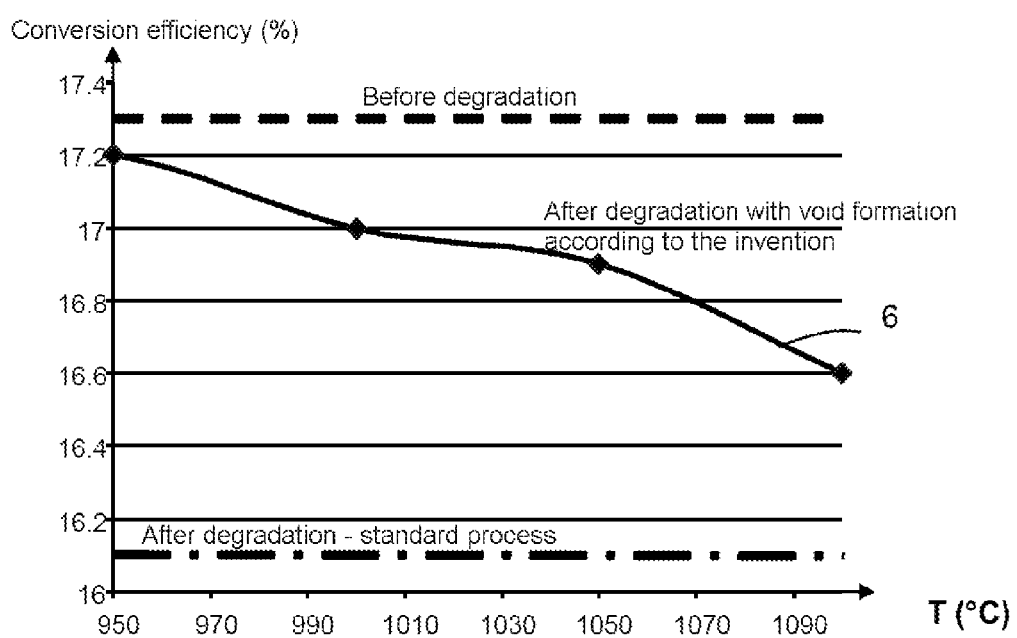
FIG. 2 illustrates the limitation of the degradation of the conversion efficiency with the invention, as a function of the temperature of the injection of voids.

A void introduction step according to the invention makes it possible to accelerate the diffusion of oxygen, and more precisely the diffusion of VO complexes. This diffusion leads to acceleration of the oxygen precipitation until the solubility limit of oxygen in silicon is reached. These oxygen diffusion and precipitation kinetics depend on the temperature at which this diffusion is carried out, that is to say the temperature applied for the formation of the voids. As the variation of the solubility limit of oxygen as a function of temperature is well known, it is known how to determine, for a given temperature applied in the step of introducing the voids, the remaining level of interstitial oxygen and consequently a value of the lifetime of the minority carriers after degradation by the LID effect. For example, in a silicon containing initially $7.10^{17}$ atoms/cm$^3$ of oxygen, after a void diffusion step at 950° C. the remaining level of interstitial oxygen is $10^7$ atoms/cm$^3$. It is thus possible to determine the conversion efficiency after degradation. This is what is represented by the curve 6 in FIG. 2, which shows the value of the conversion efficiency after degradation, obtained with the invention, as a function of the temperature at which the formation of voids is carried out. The value before degradation (upper broken curve) estimated at 17.3%, and the value after degradation when the invention is not implemented (lower broken curve), estimated at 16.1%, are also represented.

It can be seen that with an annealing temperature of 950° C. for the formation of the voids, the absolute efficiency loss is 0.1% (17.3-17.2) while it is 1.2% without the invention, i.e. 0.6% in relative terms. In this example, the losses owing to the degradation are thus limited by close to a factor of 10. Comparable results are obtained irrespective of the void formation method used, as a function of the control parameters and notably the temperature and/or the duration.

The invention claimed is:

1. A method for manufacturing a photovoltaic cell from a crystalline silicon substrate, comprising:
   at least one step of controlled introduction of voids into a silicon substrate at a temperature and for a duration enabling the formation of void-oxygen complexes with the oxygen contained in the silicon substrate, diffusion of these void-oxygen complexes, and precipitation of the oxygen,
   wherein the step of controlled introduction of voids is carried out before a step of forming an emitter of the photovoltaic cell by a diffusion of a dopant into the silicon substrate, and is one of a step of forming at least one sacrificial silicide layer, a step of ion implementation of helium or hydrogen, or a step of laser irradiation.

2. The method of claim 1, wherein said step of controlled introduction of voids by forming at least one sacrificial silicide layer includes depositing a metal layer on a face of the substrate followed by an annealing at a temperature promoting a formation of said voids in the silicon substrate.

3. The manufacturing method of claim 2, wherein the at least one sacrificial silicide layer is produced on the rear face of the substrate.

4. The manufacturing method of claim 3, wherein a metal of the deposited metal layer is nickel, and the annealing is carried out at a temperature of the order of 900° C.

5. The method of claim 2, wherein the diffusion includes a diffusion of phosphorus as the dopant into the silicon substrate in order to form an emitter, wherein the diffusion of phosphorous is carried out after removal of the at least one sacrificial silicide layer.

6. The method of claim 1, wherein the step of controlled introduction of the voids to the silicon substrate comprises the step of laser irradiation followed by an annealing at a temperature promoting formation of the voids in the substrate.

7. The manufacturing method of claim 1, wherein the step of controlled introduction of the voids to the silicon substrate comprises the step of ion implantation of helium or hydrogen followed by an annealing at a temperature promoting formation of voids in the silicon substrate.

8. The manufacturing method of claim 7, wherein the ion implantation step is a step of plasma-assisted implantation of hydrogen.

9. The manufacturing method of claim 1, wherein a hydrogenation step is carried out before the step or steps of introducing the voids.

10. The manufacturing method of claim 1, wherein the step or steps of introducing the voids are carried out under illumination of the photovoltaic cell.

11. The method of claim 3, wherein a metal of said deposited metal layer is nickel, and the annealing is carried out at a temperature of the order of 900° C.

* * * * *